US012650545B2

(12) United States Patent
Duan

(10) Patent No.: US 12,650,545 B2
(45) Date of Patent: Jun. 9, 2026

(54) DISPLAY MODULE AND ELECTRONIC DEVICE

(71) Applicant: VIVO MOBILE COMMUNICATION CO., LTD., Dongguan (CN)

(72) Inventor: Junjie Duan, Dongguan (CN)

(73) Assignee: VIVO MOBILE COMMUNICATION CO., LTD., Dongguan (CN)

( * ) Notice: Subject to any disclaimer, the term of this patent is extended or adjusted under 35 U.S.C. 154(b) by 561 days.

(21) Appl. No.: 18/105,439

(22) Filed: Feb. 3, 2023

(65) Prior Publication Data

US 2023/0189622 A1     Jun. 15, 2023

Related U.S. Application Data

(63) Continuation of application No. PCT/CN2021/110519, filed on Aug. 4, 2021.

(30) Foreign Application Priority Data

Aug. 5, 2020     (CN) .......................... 202010778799.2

(51) Int. Cl.
| | |
|---|---|
| *G02B 5/20* | (2006.01) |
| *G02B 7/00* | (2021.01) |
| *G02B 27/28* | (2006.01) |
| *G02B 5/30* | (2006.01) |

(Continued)

(52) U.S. Cl.
CPC .............. *G02B 5/20* (2013.01); *G02B 7/006* (2013.01); *G02B 27/28* (2013.01); *G02B 5/3083* (2013.01); *H10K 59/80* (2023.02); *H10K 59/90* (2023.02)

(58) Field of Classification Search
None
See application file for complete search history.

(56) References Cited

U.S. PATENT DOCUMENTS

| | | | |
|---|---|---|---|
| 2016/0149166 A1* | 5/2016 | Kwong | .................... G02B 1/08 |
| | | | 257/40 |
| 2020/0191648 A1 | 6/2020 | Wang et al. | |

(Continued)

FOREIGN PATENT DOCUMENTS

| | | |
|---|---|---|
| CN | 108347503 A | 7/2018 |
| CN | 109411519 A | 3/2019 |
| CN | 110049214 A | 7/2019 |

(Continued)

*Primary Examiner* — Dung T Nguyen
(74) *Attorney, Agent, or Firm* — The Webb Law Firm

(57) ABSTRACT

A display module includes a first filter layer, a light-emitting layer, a second filter layer, a photosensitive element, and a driving assembly. The light-emitting layer is disposed between the first filter layer and the second filter layer, the second filter layer is disposed between the light-emitting layer and the photosensitive element, and the second filter layer and the photosensitive element are opposite each other. The driving assembly drives the second filter layer to rotate, so that the second filter layer has a first state and a second state. In the first state, the first filter layer and the second filter layer constitute an ambient-light filter structure; in the second state, the first filter layer and the second filter layer constitute an ambient-light light transmission structure. A first light sensing amount of the photosensitive element is smaller than a second light sensing amount of the photosensitive element.

16 Claims, 2 Drawing Sheets

(51) Int. Cl.
    *H10K 59/80*        (2023.01)
    *H10K 59/90*        (2023.01)

(56)               References Cited

U.S. PATENT DOCUMENTS

| | | |
|---|---|---|
| 2020/0280662 A1 | 9/2020 | Gao et al. |
| 2022/0159169 A1 | 5/2022 | Tang et al. |

FOREIGN PATENT DOCUMENTS

| | | |
|---|---|---|
| CN | 110265442 A | 9/2019 |
| CN | 110764301 A | 2/2020 |
| CN | 111366242 A | 7/2020 |
| CN | 111933665 A | 11/2020 |
| KR | 1020190098537 A | 8/2019 |
| WO | 2019184809 A1 | 10/2019 |
| WO | 2020124370 A1 | 6/2020 |

\* cited by examiner

DISPLAY MODULE AND ELECTRONIC DEVICE

CROSS-REFERENCE TO RELATED APPLICATIONS

This application is a Bypass Continuation Application of PCT/CN2021/110519 filed Aug. 4, 2021, and claims priority to Chinese Patent Application No. 202010778799.2 filed Aug. 5, 2020, the disclosures of which are hereby incorporated by reference in their entireties.

BACKGROUND OF THE INVENTION

Field of the Invention

This application relates to the field of electronic technologies, and in particular, to a display module and an electronic device.

Description of Related Art

With the popularization of full screens applied to mobile phones, a front sensor at a mobile phone includes a camera, a distance sensor, a photosensitive sensor, a sound pickup, and the like. Design shall be implemented in a manner for continually playing a role. At present, some telescopic camera solutions, under-screen sensing solutions, micro-slit technology solutions, and the like exist.

In actual use, a display module may usually achieve detection of external ambient light, but because a light-emitting layer in the display module also generates light, and the light will interfere with a detection result of the ambient light, accuracy of the detection result of the ambient light is low at present.

SUMMARY OF THE INVENTION

An embodiment of this application provides an electronic device, including a first filter layer, a light-emitting layer, a second filter layer, a photosensitive element, and a driving assembly, where the light-emitting layer is disposed between the first filter layer and the second filter layer, the second filter layer is disposed between the light-emitting layer and the photosensitive element, the second filter layer is disposed opposite to the photosensitive element, and the driving assembly is connected to the second filter layer; and the driving assembly drives the second filter layer to rotate, to enable the second filter layer to have a first state and a second state, where in the first state, the first filter layer and the second filter layer form an ambient-light filter structure; and in the second state, the first filter layer and the second filter layer form an ambient-light light transmission structure;

a first amount of light received by the photosensitive element is less than a second amount of light received by the photosensitive element, and the first amount of light is an amount of light received by the photosensitive element when the second filter layer is in the first state; and the second amount of light is an amount of light received by the photosensitive element when the second filter layer is in the second state.

DESCRIPTION OF THE INVENTION

The following clearly describes the technical solutions in the embodiments of this application with reference to the accompanying drawings in the embodiments of this application. Apparently, the described embodiments are some but not all of the embodiments of this application. All other embodiments obtained by a person of ordinary skill in the art based on the embodiments of this application shall fall within the protection scope of this application.

The terms "first", "second", and the like in the specification and claims of this application are used to distinguish between similar objects instead of describing a specific order or sequence. It should be understood that data used in this way may be interchangeable in an appropriate case, so that the embodiments of this application can be implemented in a sequence other than those shown or described herein, and objects distinguished by "first" and "second" are generally of a same type, and a quantity of objects is not limited. For example, there may be one or more first targets. In addition, in the specification and the claims, "and/or" represents at least one of connected objects, and a character "/" generally represents an "or" relationship between associated objects.

With reference to the accompanying drawings, an electronic device provided in the embodiments of this application will be described in detail by using specific examples and application scenarios thereof.

Figure 1:
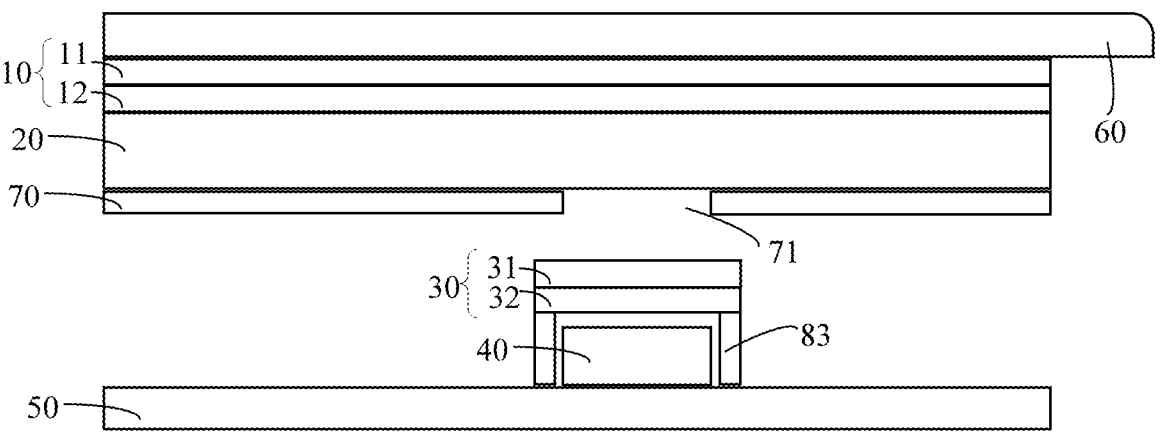
FIG. 1 is a first schematic structural diagram of a display module according to an embodiment of this application.
Figure 2:
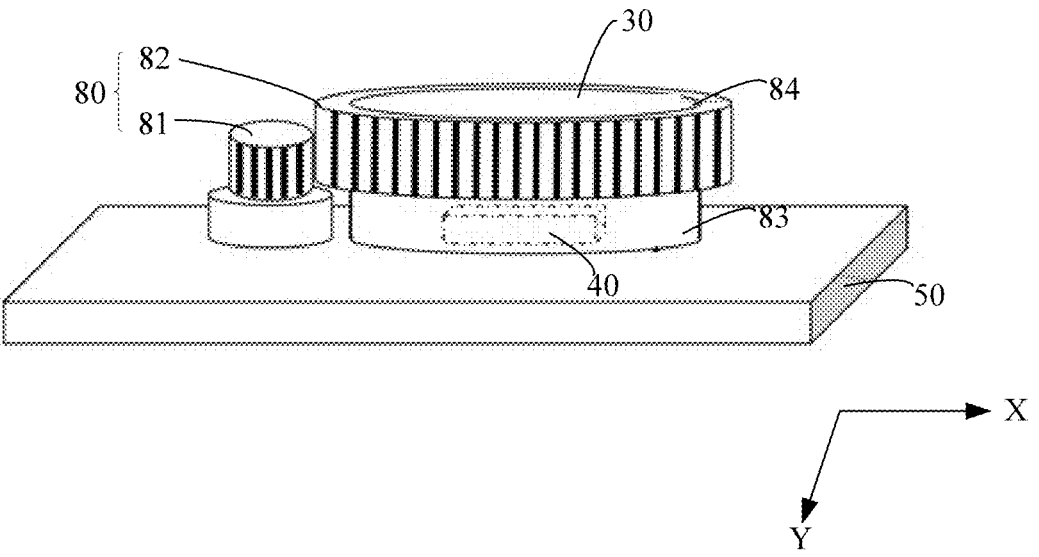
FIG. 2 is a second schematic structural diagram of a display module according to an embodiment of this application.

Referring to FIG. 1 and FIG. 2, an embodiment of this application provides a display module. As shown in FIG. 1 and FIG. 2, the display module includes a first filter layer 10, a light-emitting layer 20, a second filter layer 30, a photosensitive element 40, and a driving assembly 80, the light-emitting layer 20 is disposed between the first filter layer 10 and the second filter layer 30, the second filter layer 30 is disposed between the light-emitting layer 20 and the photosensitive element 40, the second filter layer 30 is disposed opposite to the photosensitive element 40, and the driving assembly is connected to the second filter layer 30.

The driving assembly 80 drives the second filter layer 30 to rotate, to enable the second filter layer 30 to have a first state and a second state.

In the first state, the first filter layer 10 and the second filter layer 30 form an ambient-light filter structure. In the second state, the first filter layer 10 and the second filter layer 30 form an ambient-light light transmission structure.

A first amount of light received by the photosensitive element 40 is less than a second amount of light received by the photosensitive element 40, and the first light sensitivity is an amount of light received by the photosensitive element 40 when the second filter layer 30 is in the first state. The second amount of light is an amount of light received by the photosensitive element 40 when the second filter layer 30 is in the second state.

That is, the amount of light received by the photosensitive element 40 when the second filter layer 30 is in the first state is less than the amount of light received by the photosensitive element 40 when the second filter layer 30 is in the second state.

Transmittance of the ambient light is low in the ambient-light filter structure, and is high in the ambient-light light transmission structure. Accordingly, light energy received by the photosensitive element 40 in the first state is less than that received by the photosensitive element 40 in the second state, that is, the amount of light received by the photosensitive element 40 in the first state is less than that of the photosensitive element 40 in the second state.

Light received by the photosensitive element 40 in the first state may include ambient light (basically negligible) and light from the light-emitting layer 20. Light received by the photosensitive element 40 in the second state may include the ambient light and light from the light-emitting layer 20. Then, a difference between the light received by the photosensitive element 40 in the first state and that in the second state is calculated, and the difference is a detection result of the ambient light. When the photosensitive element 40 receives less ambient light in the first state, an error of the detection result of the ambient light is smaller, that is, accuracy of the detection result of the ambient light is higher. For example, the transmittance of the ambient light in the ambient-light light transmission structure may be 100%, and the transmittance of the ambient light in the ambient-light filter structure may be relatively low (such as 20%, 10%, or 0). When the transmittance of the ambient light in the ambient-light filter structure is 0 (that is, the second filter layer 30 is in the first state), the error of the detection result of the ambient light is relatively small.

It should be noted that the display module in this embodiment of this application may be applied to the electronic device.

To improve the accuracy of the detection result of the ambient light, as an optional implementation, in the first state, a polarization direction of the second filter layer 30 is perpendicular to a polarization direction of the first filter layer 10, and in this case, first light emitted by the light-emitting layer 20 is transmitted to the photosensitive element 40 only through the second filter layer 30; and in the second state, the polarization direction of the second filter layer 30 is parallel with the polarization direction of the first filter layer 10, and in this case, the first light emitted by the light-emitting layer 20 and second light in an external environment (also referred to as ambient light) are transmitted to the photosensitive element 40 through the second filter layer 30.

For a working principle of this embodiment of this application, please refer to the following descriptions.

Under a driving action of the driving assembly 80, the second filter layer 30 may rotate (a rotation center may be a geometric center of the photosensitive element 40, that is, the second filter layer 30 may rotate around an axis perpendicularly passing through the geometric center of the photosensitive element 40), so that the second filter layer 30 may have the first state and the second state. In the first state, the polarization direction of the second filter layer 30 is perpendicular (also called orthogonal) to the polarization direction of the first filter layer 10. In this case, the first light emitted by the light-emitting layer 20 is transmitted to the photosensitive element 40 only through the second filter layer 30, that is, the second light in the external environment cannot be transmitted to the photosensitive element 40 through the first filter layer 10 and the second filter layer 30. In the second state, the polarization direction of the second filter layer 30 is parallel to the polarization direction of the first filter layer 10. In this case, the first light emitted by the light-emitting layer 20 and the second light in the external environment (also referred to as the ambient light) are transmitted to the photosensitive element 40 through the second filter layer 30. This way, a value of the second light in the external environment may be obtained by subtracting a value of light detected in the photosensitive element 40 in the first state from a value of light detected in the photosensitive element 40 in the second state. The influence of self-emitting light (that is, the first light) of the light-emitting layer 20 on the accuracy of the detection result of the photosensitive element 40 is reduced, the error of the detection result of the ambient light is reduced, and then the accuracy of the detection result of the ambient light is increased.

It should be noted that, compared with a manner in which two photosensitive elements 40 are disposed, in this embodiment of this application, only one photosensitive element 40 is required, which reduces space occupied by the photosensitive element 40 in the electronic device, thus reducing a volume of the entire electronic device. In addition, compared with a manner in which one photosensitive element 40 of two photosensitive elements 40 detects the first light and the other photosensitive element 40 detects the first light and the second light, the two photosensitive elements 40 are generally disposed side by side. This way, different positions of the two photosensitive elements 40 lead to an error in values of light detected by the two photosensitive elements 40. In this embodiment of this application, only one photosensitive element 40 is used to detect the light, which reduces the error and enhances the accuracy of the detection result. In addition, only one photosensitive element 40 is required in this embodiment of this application, which reduces a manufacturing difficulty and assembly difficulty, and improves manufacturing efficiency and assembly efficiency.

Figure 3:
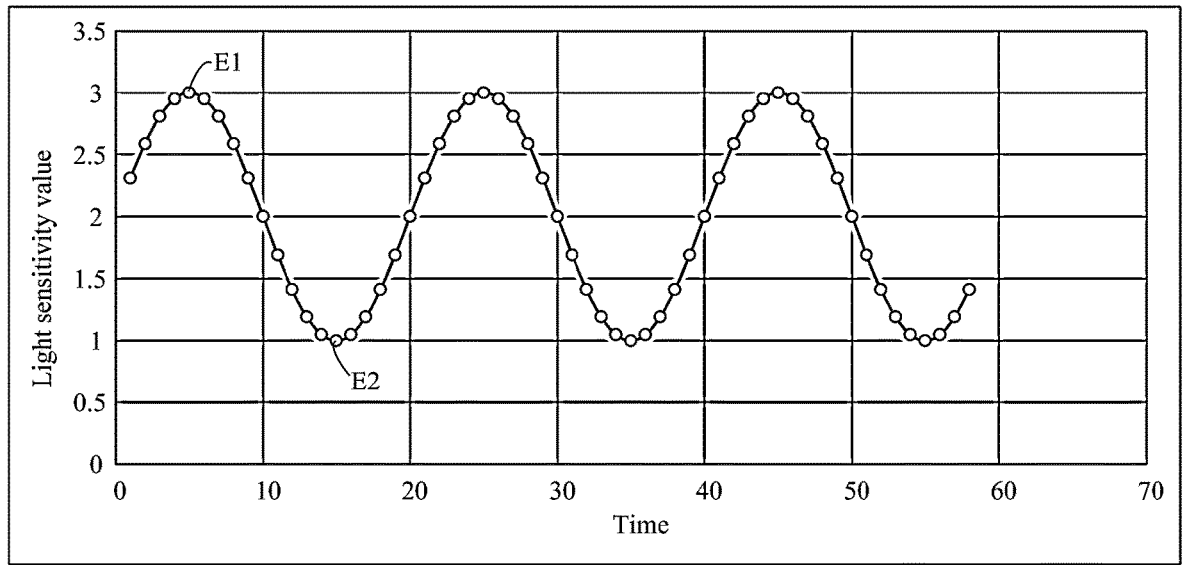
FIG. 3 is a diagram of a correspondence between time and a light sensitivity value in a photosensitive element according to an embodiment of this application.

What's more, during rotation of the second filter layer 30, the polarization direction of the second filter layer 30 and the polarization direction of the first filter layer 10 are in a state between an orthogonal state and a parallel state, and the photosensitive element 40 receives a signal that fluctuates greatly, where a peak point of the signal is E1 and a valley point of the signal is E2, as shown in FIG. 3. We may obtain E1 and E2 by capturing a peak value and a valley value with a preset algorithm, and then calculate intensity of the second light in the external environment and intensity of screen light (that is, intensity of the first light emitted by the light-emitting layer 20) by E1 and E2.

For example, it is assumed that the light emitted by the light-emitting layer 20 is light emitted by an organic light-emitting diode (Organic Light-Emitting Diode, OLED), referred to as $E_o$, and external ambient light, referred to as $E_e$. Energy values of the photosensitive element 40 are shown in FIG. 1.

TABLE 1

| | Initial value | Transmittance of the first filter layer and light-emitting layer | Transmittance of the second filter layer | Remaining (measurement value) |
|---|---|---|---|---|
| Photosensitive element in the first state-ambient light $E_{1e}$ | 100% | 4% | 0% | 0% |

TABLE 1-continued

| | Initial value | Transmittance of the first filter layer and light-emitting layer | Transmittance of the second filter layer | Remaining (measurement value) |
|---|---|---|---|---|
| Photosensitive element in the second state-ambient light $E_{2e}$ | 100% | 4% | 100% | 4% |
| Photosensitive element in the first state-OLED light $E_{1o}$ | 100% | | 45% | 45% |
| Photosensitive element in the second state-OLED light $E_{2o}$ | 100% | | 100% | 100% |

It is assumed that in the first state, an illuminance value of the photosensitive element 40 is E1, which includes the ambient light $E_{1e}$ reaching the photosensitive element 40 and OLED self-emitting light $E_{1o}$; similarly, in the second state, the illuminance value of the photosensitive element 40 is E2, which includes the ambient light $E_{2e}$ reaching the photosensitive element 40 and OLED self-emitting light $E_{2o}$.

E1 and E2 are obtained by reading from the photosensitive element 40, and $E_e$ and $E_o$ are desired data. In this case, we can obtain $E_e$ and $E_o$ through a simple relationship.

$$E_1 = E_{1e} + E_{1O} = 0 + E_O*45\%;$$

$$E_2 = E_{2O} + E_{2O} = E_e*4\% + E_j*100\%;$$

by solving, obtain $$E_O = \frac{E_1}{45\%}, \quad E_e = \frac{E_2 - E_O}{4\%}.$$

It should be noted that as an optional implementation, the photosensitive element 40 includes at least one of a photosensitive sensor, an infrared sensor, a fingerprint sensor, or a camera module. This way, diversity of the photosensitive element 40 is increased, and an intelligence degree of the electronic device is also improved.

In a case that the photosensitive element 40 includes the photosensitive sensor, and a value of the second light in the external environment is obtained by calculation, a controller of the electronic device may control other components in the electronic device to perform a target operation. The target operation may include at least one of the following: adjusting display brightness of a display screen, adjusting contrast of a display screen, or adjusting a backlight color of a display screen.

In a case that the photosensitive element 40 includes the infrared sensor, and the value of the second light in the external environment is obtained by calculation, the second light may be infrared light that is emitted by the light-emitting layer 20, projected from the display screen, and then reflected when encountering an obstacle. This way, in a case that the value of the second light is obtained by calculation, a distance between the obstacle and the electronic device may be determined according to the value, and a state of the display screen may be determined as an on state or off state according to the distance.

When the photosensitive element 40 includes the fingerprint sensor or camera module, an image may be obtained in the first state or the second state. For example, when an image is obtained in the first state, because only the first light is transmitted to the photosensitive element 40, the influence of the second light in the external environment on imaging quality is reduced; and when an image is obtained in the second state, because both the first light and the second light may be transmitted to the photosensitive element 40, display brightness of the obtained image is enhanced.

As an optional implementation, the electronic device further includes a printed circuit board 50, and the photosensitive element 40 is disposed on the printed circuit board 50. This way, the photosensitive element 40 may be supplied with power through the printed circuit board 50, and the printed circuit board 50 may also support the photosensitive element 40.

It should be noted that when the electronic device is provided with a first sleeve 84 and a second sleeve 83 (please refer to corresponding description below for details, which will not be described herein), the first sleeve 84 and the second sleeve 83 may also be disposed on the printed circuit board 50, the photosensitive element 40 may be disposed in the second sleeve 83, and the photosensitive element 40 is electrically connected to the printed circuit board 50. This way, the first sleeve 84 and the second sleeve 83 can also be supported.

Specific structures of the first filter layer 10 and the second filter layer 30 are not limited herein, and both the first filter layer 10 and the second filter layer 30 are configured to change a polarization direction of light.

In addition, referring to FIG. 1, the electronic device may further include a light-transmitting cover plate 60, and the light-transmitting cover plate 60 abuts against a surface of the first filter layer 10 facing away from the light-emitting layer 20, so that the first filter layer 10 can be protected.

As an optional implementation, referring to FIG. 1, the first filter layer 10 includes a first linear polarizer 11 and a first quarter-wave plate 12, and the first quarter-wave plate 12 is disposed between the first linear polarizer 11 and the light-emitting layer 20.

As an optional implementation, referring to FIG. 1, the second filter layer 30 includes a second linear polarizer 32 and a second quarter-wave plate 31, and the second quarter-wave plate 31 is disposed between the second linear polarizer 32 and the light-emitting layer 20.

In this implementation of this application, because the first filter layer 10 includes the first linear polarizer 11 and the first quarter-wave plate 12, and the second filter layer 30 includes the second linear polarizer 32 and the second quarter-wave plate 31, while light is filtered, use costs can be reduced and an assembly process can be simplified.

The first quarter-wave plate 12 and the second quarter-wave plate 31 may be called a quarter-wave plate or a quarter-wave plate λ respectively, and the polarization direction of the first filter layer 10 may be a polarization direction of the first linear polarizer 11, and a polarization direction of the second filter layer 30 may be a polarization direction of the second linear polarizer 32. For example, referring to FIG. 2, the polarization direction of the first linear polarizer 11 may be an X direction or a Y direction, and correspondingly, the polarization direction of the second linear polarizer 32 may also be the X direction or Y direction.

As an optional implementation, the first linear polarizer 11 and the first quarter-wave plate 12 may be stacked, and the second linear polarizer 32 and the second quarter-wave plate 31 may be stacked. As another optional implementation, the first linear polarizer 11 and the first quarter-wave plate 12 may be spaced apart, and the second linear polarizer 32 and the second quarter-wave plate 31 may be spaced apart. For example, the first linear polarizer 11 and the first quarter-wave plate 12 may be spaced apart by an adhesive layer, or a gap may exist between the first linear polarizer 11 and the first quarter-wave plate 12. Correspondingly, for a position relationship between the second linear polarizer 32 and the second quarter-wave plate 31, please refer to related description of the first linear polarizer 11 and the first quarter-wave plate 12, which will not be described herein again.

A specific type of the light-emitting layer 20 is not limited herein. As an optional implementation, the light-emitting layer 20 is an organic light-emitting diode (Organic Light-Emitting Diode, OLED) light-emitting layer. This way, the light-emitting layer 20 may have a relatively good light emitting effect.

It should be noted that when the light-emitting layer 20 is the OLED light-emitting layer, the light-emitting layer 20 and the first filter layer 10 may be combined to form a part of the display module, that is, the light-emitting layer and the first filter layer 10 may form two parts of an OLED display module.

As an optional implementation, referring to FIG. 1, a light-shielding layer 70 is further disposed between the light-emitting layer 20 and the second filter layer 30, and a light-transmitting hole 71 is disposed at a position where the light-shielding layer 70 is opposite to the second filter layer 30. This way, because a position that is at the light-shielding layer 70 and not provided with the light-transmitting hole 71 can shield light, the influence of other light on accuracy of the detection result of the photosensitive element 40 is further reduced, that is, the accuracy of the detection result of the photosensitive element 40 is further increased.

A material of the light-shielding layer 70 is not specifically limited herein. For example, the light-shielding layer 70 may be a light-shielding foam layer, which can reduce the use costs and can also play a buffering role between the light-emitting layer 20 and the second filter layer 30. In addition, the light-shielding layer 70 may be a light-shielding rubber layer, a light-shielding plating layer, or the like.

Optionally, referring to FIG. 1 and FIG. 2, the driving assembly 80 includes a power element 81, a transmission element 82, a first sleeve 84, and a second sleeve 83. The first sleeve 84 is sleeved on the second sleeve 83. The power element 81 is connected to the first sleeve 84 through the transmission element 82, and drives, through the transmission element 82, the first sleeve 84 to rotate around the second sleeve 83. The photosensitive element 40 is disposed in the second sleeve 83, and the second filter layer 30 is disposed on the first sleeve 84.

The second filter layer 30 may be disposed on an end face of the first sleeve 84 facing the light-emitting layer 20.

This way, because the photosensitive element 40 is disposed in the second sleeve 83, a fixing effect for the photosensitive element 40 and a supporting effect for the second filter layer 30 are enhanced.

The first sleeve 84 and the second sleeve 83 may be cylindrical supports. In addition, a material of the first sleeve 84 and the second sleeve 83 is not limited herein. For example, the first sleeve 84 and the second sleeve 83 may be metal or insulating supports.

Optionally, referring to FIG. 2, the transmission element 82 is a transmission gear, the transmission gear is sleeved on the first sleeve 84, and the transmission gear is fixedly connected to the first sleeve 84. This way, a connection surface between the transmission gear and the first sleeve 84 is increased, and then a transmission effect for the first sleeve 84 is enhanced.

The power element 81 may be a driving motor, and definitely, the driving motor may also be called a driving motor. In addition, the transmission element 82 may also be a gear set. Alternatively, the transmission element 82 may also be a combination of a transmission shaft and a transmission gear. A specific manner is not limited herein, so that diversity and flexibility of the driving assembly 80 are increased.

As an optional implementation, an outer wall of the second sleeve 83 is provided with a position-limiting component. This way, because the outer wall of the second sleeve 83 is provided with the position-limiting component, the first sleeve 84 may be prevented from sliding along an axial direction of the second sleeve 83, so that limiting of the first sleeve 84 may be enhanced, that is, the first sleeve 84 rotates around the second sleeve 83 in an area on a side where the position-limiting component is located.

An embodiment of this application also provides an electronic device, including the display module in the foregoing embodiment. Because the electronic device provided in this embodiment of this application includes the display module in the foregoing embodiment, a same beneficial technical effect as the foregoing embodiment can be achieved, and for a structure of the display module, please refer to the corresponding description in the foregoing embodiment, which will not be described herein again.

The embodiments of this application are described above with reference to the accompanying drawings, but this application is not limited to the foregoing specific implementations. The foregoing specific implementations are merely schematic instead of restrictive. Under enlightenment of this application, a person of ordinary skills in the art may make many forms without departing from aims and the protection scope of claims of this application, all of which fall within the protection scope of this application.

What is claimed is:

1. A display module, comprising: a first filter layer, a light-emitting layer, a second filter layer, a photosensitive element, and a driving assembly, wherein the light-emitting layer is disposed between the first filter layer and the second filter layer, the second filter layer is disposed between the light-emitting layer and the photosensitive element, the second filter layer is disposed opposite to the photosensitive element, and the driving assembly is connected to the second filter layer; and the driving assembly drives the second filter layer to rotate, to enable the second filter layer to have a first state and a second state, wherein in the first state, the first filter layer and the second filter layer form an ambient-light filter structure; and in the second state, the first filter layer and the second filter layer form an ambient-light light transmission structure;

a first amount of light received by the photosensitive element is less than a second amount of light received by the photosensitive element, and the first amount of light is an amount of light received by the photosensitive element when the second filter layer is in the first state; and the second amount of light is an amount of light received by the photosensitive element when the second filter layer is in the second state; wherein the driving assembly comprises a power element, a transmission element, a first sleeve, and a second sleeve; the first sleeve is sleeved on the second sleeve; the power element is connected to the first sleeve through the transmission element, and drives the first sleeve to rotate around the second sleeve by the transmission element; the photosensitive element is disposed in the second sleeve, and the second filter layer is disposed on the first sleeve.

2. The display module according to claim 1, wherein in the first state, a polarization direction of the second filter layer is perpendicular to a polarization direction of the first filter layer; and in the second state, the polarization direction of the second filter layer is parallel with the polarization direction of the first filter layer.

3. The display module according to claim 1, wherein the first filter layer comprises a first linear polarizer and a first quarter-wave plate, and the first quarter-wave plate is disposed between the first linear polarizer and the light-emitting layer.

4. The display module according to claim 1, wherein the second filter layer comprises a second linear polarizer and a second quarter-wave plate, and the second quarter-wave plate is disposed between the second linear polarizer and the light-emitting layer.

5. The display module according to claim 1, wherein the light-emitting layer is an organic light-emitting diode (OLED) light-emitting layer.

6. The display module according to claim 1, wherein a light-shielding layer is further disposed between the light-emitting layer and the second filter layer, and a light-transmitting hole is disposed at a position where the light-shielding layer is opposite to the second filter layer.

7. The display module according to claim 1, wherein the transmission element is a transmission gear, the transmission gear is sleeved on the first sleeve, and the transmission gear is fixedly connected to the first sleeve.

8. The display module according to claim 1, wherein an outer wall of the second sleeve is provided with a position-limiting component.

9. An electronic device, comprising a display module; wherein the display module comprises a first filter layer, a light-emitting layer, a second filter layer, a photosensitive element, and a driving assembly; the light-emitting layer is disposed between the first filter layer and the second filter layer, the second filter layer is disposed between the light-emitting layer and the photosensitive element, the second filter layer is disposed opposite to the photosensitive element, and the driving assembly is connected to the second filter layer; and the driving assembly drives the second filter layer to rotate, to enable the second filter layer to have a first state and a second state, wherein in the first state, the first filter layer and the second filter layer form an ambient-light filter structure; and in the second state, the first filter layer and the second filter layer form an ambient-light light transmission structure;

a first amount of light received by the photosensitive element is less than a second amount of light received by the photosensitive element, and the first amount of light is an amount of light received by the photosensitive element when the second filter layer is in the first state; and the second amount of light is an amount of light received by the photosensitive element when the second filter layer is in the second state; wherein the driving assembly comprises a power element, a transmission element, a first sleeve, and a second sleeve; the first sleeve is sleeved on the second sleeve; the power element is connected to the first sleeve through the transmission element, and drives the first sleeve to rotate around the second sleeve by the transmission element; the photosensitive element is disposed in the second sleeve, and the second filter layer is disposed on the first sleeve.

10. The electronic device according to claim 9, wherein in the first state, a polarization direction of the second filter layer is perpendicular to a polarization direction of the first filter layer; and in the second state, the polarization direction of the second filter layer is parallel with the polarization direction of the first filter layer.

11. The electronic device according to claim 9, wherein the first filter layer comprises a first linear polarizer and a first quarter-wave plate, and the first quarter-wave plate is disposed between the first linear polarizer and the light-emitting layer.

12. The electronic device according to claim 9, wherein the second filter layer comprises a second linear polarizer and a second quarter-wave plate, and the second quarter-wave plate is disposed between the second linear polarizer and the light-emitting layer.

13. The electronic device according to claim 9, wherein the light-emitting layer is an organic light-emitting diode (OLED) light-emitting layer.

14. The electronic device according to claim 9, wherein a light-shielding layer is further disposed between the light-emitting layer and the second filter layer, and a light-transmitting hole is disposed at a position where the light-shielding layer is opposite to the second filter layer.

15. The electronic device according to claim 10, wherein the transmission element is a transmission gear, the transmission gear is sleeved on the first sleeve, and the transmission gear is fixedly connected to the first sleeve.

16. The electronic device according to claim 10, wherein an outer wall of the second sleeve is provided with a position-limiting component.

* * * * *